United States Patent
Khoury

(10) Patent No.: US 9,590,644 B2
(45) Date of Patent: Mar. 7, 2017

(54) MANAGING SPURS IN A RADIO FREQUENCY CIRCUIT

(71) Applicant: Silicon Laboratories Inc., Austin, TX (US)

(72) Inventor: John M Khoury, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 14/616,624

(22) Filed: Feb. 6, 2015

(65) Prior Publication Data

US 2016/0233869 A1    Aug. 11, 2016

(51) Int. Cl.
*H03L 7/099*    (2006.01)
*H04B 1/10*    (2006.01)

(52) U.S. Cl.
CPC .............. *H03L 7/099* (2013.01); *H04B 1/10* (2013.01)

(58) Field of Classification Search
CPC . H04B 17/20; H04B 1/30; H04B 1/28; H04B 1/38; H04L 2027/0016; H04L 2027/0024; H04L 27/0014; H04L 27/0002; H03L 7/0805; H03L 7/0995; H03L 7/16; H03L 7/0807; H03L 7/087; H03L 7/06; H03L 7/02
USPC ........ 327/105, 107, 117, 156, 157, 158, 337
See application file for complete search history.

(56) References Cited

U.S. PATENT DOCUMENTS

| | | |
|---|---|---|
| 3,805,043 A | 4/1974 | Clary |
| 3,911,368 A | 10/1975 | Tarczy-hornoch |
| 3,987,490 A | 10/1976 | Highnote et al. |
| 4,027,242 A | 5/1977 | Yamanaka |
| 4,225,969 A | 9/1980 | Hong |
| 4,551,689 A * | 11/1985 | Scala ........................ H03L 7/23 331/2 |
| 4,590,439 A | 5/1986 | Goggin |
| 5,301,367 A | 4/1994 | Heinonen |
| 5,436,600 A | 7/1995 | Van Heteren et al. |
| 5,444,865 A | 8/1995 | Heck et al. |
| 5,465,409 A | 11/1995 | Borras et al. |
| 5,535,337 A | 7/1996 | Hogan et al. |
| 5,669,067 A | 9/1997 | Mambo |
| 5,844,868 A | 12/1998 | Takahashi et al. |

(Continued)

OTHER PUBLICATIONS

Chen, "A Spurious Emission Reduction Technique for Power Amplifiers Using Frequency Hopping DC-DC Converters", Department of Engineering Science and Ocean Engineering, National Taiwan University, pp. 145-148, 2009, Taipei, Taiwan.

*Primary Examiner* — John Poos
(74) *Attorney, Agent, or Firm* — Cesari & Reed LLP; R. Michael Reed

(57) ABSTRACT

In some embodiments, an integrated circuit may include a radio frequency synthesizer configured to provide a local oscillator (LO) signal at a selected frequency related to a frequency of interest. The integrated circuit may also include a re-clocking circuit having a first input to receive a clock signal having a first frequency, a second input to receive a local timing signal related to the LO signal, and an output. The re-clocking circuit may be configured to provide a local timing output signal that is a frequency adjusted version of the clock signal based upon the local re-clocking signal. The integrated circuit further may include a digital circuit including an input to receive the local timing output signal as a digital clock signal in a receive mode.

24 Claims, 14 Drawing Sheets

(56) References Cited

U.S. PATENT DOCUMENTS

| | | |
|---|---|---|
| 5,987,309 A | 11/1999 | Adachi et al. |
| 6,085,075 A | 7/2000 | Van Bezooijen |
| 6,201,952 B1 | 3/2001 | Shimizu et al. |
| 6,326,851 B1 | 12/2001 | Staszewski et al. |
| 6,606,004 B2 | 8/2003 | Staszewski et al. |
| 6,621,853 B1 | 9/2003 | Ku |
| 6,625,422 B1 | 9/2003 | Haruyama |
| 6,678,503 B1 | 1/2004 | Black et al. |
| 6,968,017 B2 | 11/2005 | Nielsen |
| 6,995,808 B2 | 2/2006 | Kovacic et al. |
| 7,003,274 B1 | 2/2006 | Olip |
| 7,269,228 B2 | 9/2007 | Shiung |
| 7,272,373 B2 | 9/2007 | Tuttle et al. |
| 7,444,167 B2 | 10/2008 | Chang et al. |
| 7,471,940 B2 | 12/2008 | Tuttle et al. |
| 7,515,931 B2 | 4/2009 | Olip |
| 7,551,127 B2 | 6/2009 | Dubash et al. |
| 7,593,695 B2 | 9/2009 | Jensen |
| 7,620,095 B2 | 11/2009 | Ben-Bassat |
| 7,680,227 B2 | 3/2010 | Kavadias et al. |
| 7,907,922 B2 | 3/2011 | Lee et al. |
| 8,259,876 B2 | 9/2012 | Shi et al. |
| 8,502,610 B2 | 8/2013 | Pellon et al. |
| 8,509,363 B2 | 8/2013 | Shi et al. |
| 8,705,654 B1 | 4/2014 | Khlat et al. |
| 2007/0291823 A1 | 12/2007 | Ben-Bassat |
| 2008/0248765 A1 | 10/2008 | Gater |
| 2009/0058477 A1 | 3/2009 | Curtis |
| 2009/0175399 A1 | 7/2009 | Sun et al. |
| 2009/0238312 A1 | 9/2009 | Shi et al. |
| 2010/0097966 A1 | 4/2010 | Chen |
| 2010/0149033 A1 | 6/2010 | Abraham |
| 2010/0166123 A1 | 7/2010 | Pellon et al. |
| 2010/0201365 A1 | 8/2010 | Bollenbeck |
| 2011/0267025 A1 | 11/2011 | Wang et al. |
| 2012/0225629 A1 | 9/2012 | Shi et al. |
| 2013/0229954 A1 | 9/2013 | Narathong et al. |

\* cited by examiner

US 9,590,644 B2

MANAGING SPURS IN A RADIO FREQUENCY CIRCUIT

FIELD

The present disclosure is generally related to circuits and methods of managing spurs in a radio frequency circuit, chip or system.

BACKGROUND

Radio frequency (RF) receivers are used in a wide variety of devices including, but not limited to, televisions, radios, mobile phones, pagers, global positioning system (GPS) devices, cable modems, cordless phones, door opening systems, and other devices that receive or transmit RF signals. In some examples, RF receivers may utilize frequency translation or mixing.

The majority of typical RF receivers perform frequency translation or mixing using an oscillator and an analog multiplier or mixer. An oscillator will typically output a local oscillator (LO) signal in the form of a sine wave or periodic waveform having a tuned frequency ($f_{LO}$). A mixer may be configured to mix the RF input signal spectrum, which may include desired spectral content at a target channel having a particular center frequency ($f_{CH}$), with the LO signal to form an output signal having spectral content at frequencies equal to the sum and difference of the two input frequencies, namely $f_{CH}+f_{LO}$ and $f_{CH}-f_{LO}$. One of these components forms the channel center frequency translated to the desired IF frequency, and the other component can be filtered out.

Unfortunately, sensitive analog circuits or receiver circuits can be sensitive to interference from nearby circuitry. In particular, nearby circuitry can produce electromagnetic interference, which can be coupled into the receive channel and which can introduce noise or spurs within the channel of interest. Thus, coupling interference from nearby circuits can present a problem for monolithic integrated circuits, multiple chips in a single package, or even multiple chips on a printed circuit board.

SUMMARY

In some embodiments, an integrated circuit may include a radio frequency (RF) synthesizer configured to provide a local oscillator (LO) signal at a selected frequency related to a channel of interest within an RF input signal. The integrated circuit may further include a re-clocking circuit including a first input to receive a clock signal, a second input to receive a local re-clocking signal related to the LO signal, and an output to provide a local timing output signal. The local timing output signal may be a frequency adjusted version of the clock signal based upon the local re-clocking signal. The integrated circuit may also include a digital circuit including an input to receive the local timing output signal as a digital clock signal.

In other embodiments, an integrated circuit may include a clock system configured to provide a local timing signal at a selected frequency related to a frequency of interest. The clock system may include a clock signal generator including an input configured to receive a clock signal from a clock signal source, and including an output to provide the local timing signal. The clock system may also include a re-clocking circuit including a first input to receive the clock signal having a first frequency, a second input to receive the local timing signal, and an output. The re-clocking circuit may be configured to provide a local timing output signal.

The integrated circuit may also include a controller configured to determine an operating mode and to selectively provide a control signal to select one of the local timing output signal and the clock signal in response to determining the operating mode.

In still other certain embodiments, a method may include receiving a clock signal having a first frequency from a clock source at first input of an integrated circuit and re-clocking the clock signal using a local timing signal having a second frequency that is related to a frequency of interest to produce a local timing output signal. The method may further include selectively retiming digital circuitry using one of the clock signal and the local timing output signal without changing the average frequency of operation of the digital circuitry.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Figure 1:
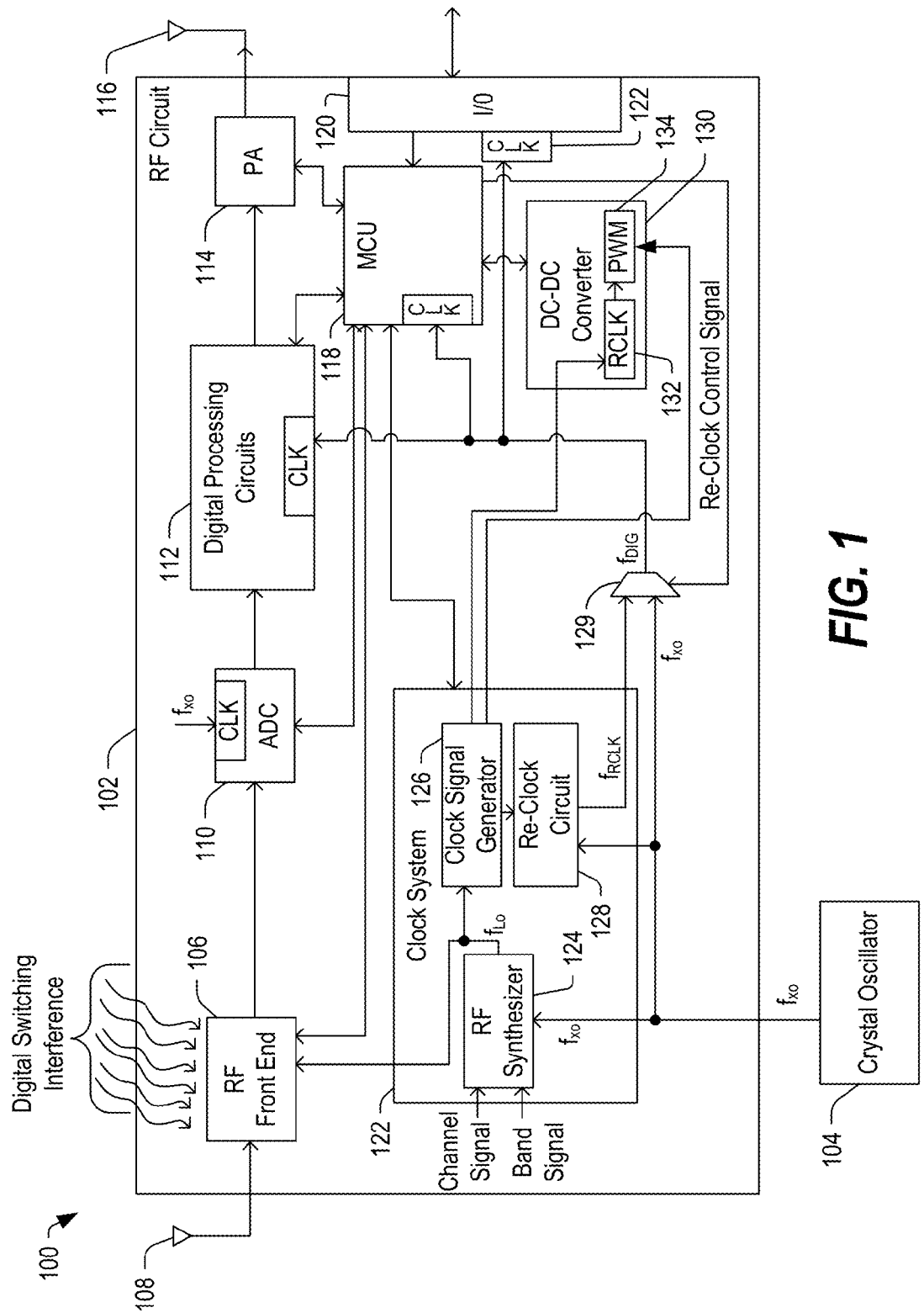
FIG. 1 is a block diagram of an integrated circuit including a clock system configured to re-clock signals, in accordance with certain embodiments of the present disclosure.

Switching events and signals within nearby circuitry may produce noise or interference within sensitive analog circuits and RF receiver circuits. In an example, harmonics from switching of digital circuitry operating within an integrated circuit, circuitry of a direct-current to direct-current (DC-DC) converter operating within the integrated circuit, or any combination thereof may generate noise or spurs in the RF frequency band, such as at 2.4 GHz, where the received signals may have an amplitude in the micro volt (µV) range. In some examples, frequency planning techniques may involve controlling the frequency of all circuits that switch on the integrated circuit (IC) by changing the frequency of operation as the desired receive channel is varied to reduce spurs in the desired passband. However, in microcontroller units (MCUs) that are often connected to other off-chip circuitry, the frequency of operation sometimes cannot be changed without affecting the operation of the system.

Embodiments of circuits and methods are described below that may reduce or null spur energy at or near the RF passband that may couple from the DC-DC converter, the digital route, the digital circuits controlled or driven using clock signals transmitted through the digital route, from the chip-level general purpose input/output (GPIOs), other digital circuits, or any combination thereof. This re-clocking may also be implemented without changing the average frequency of operation of any of the circuits and without spreading the spur energy. In some embodiments, the circuits and methods may place this null in or near the RF passband to provide a band-reject filtering effect with respect to spurs by re-clocking digital circuits based upon a local oscillator (LO) signal that is being generated and used to receive a selected channel. While spurs may still exist in the RF spectrum from the digital switching, the spurs may be moved away from the selected RF passband through the re-clocking described herein.

In certain embodiments, a circuit may be provided that may re-time or re-clock the clock signal using a local timing signal to place the spectral null in or near the RF passband. In some embodiments, the re-timing of the clock signal maintains the average frequency of operation; however, the instantaneous frequency can vary from cycle-to-cycle due to re-timing, which variation may be controlled within limits. In certain embodiments, the re-timing clock may be selected to be at a much higher frequency relative to the frequency of the clock signal being re-timed such that the variation may be controlled.

In certain further embodiments, the RF receiver circuits may be configured to operate in a number of different RF frequency bands, and these frequency bands of operation may be selected through a band selection control signal. Within the selected frequency band, the RF receiver circuits can be configured to tune a selected channel based upon a channel selection signal. In response to the channel selection signal, the RF receiver circuit may generate a local oscillator (LO) signal that may be used to down-convert the selected channel from its original RF channel frequencies to lower frequencies. As such, the center frequency for the selected channel can be down-converted to an IF (intermediate frequency). This IF can also be adjusted based upon one or both of the selected channel and the selected band. Example frequency bands and channels include the Zigbee® band and channels (e.g., IEEE 802.15.4), WiFi bands and channels (e.g., 802.11 a/b/g/n), other desired frequency bands and channels, or any combination thereof. The RF receiver circuits can also be configured to operate in a single frequency band, if desired. Other variations could also be implemented.

Possible example embodiments of circuits are described below with respect to FIG. 1, FIGS. 2A-B, FIG. 5, and FIG. 8 that may be configured to re-clock one or more clock signals provided to digital circuits (e.g., digital processing circuits, an MCU, an digital interface, other digital circuits, or any combination thereof) through a digital route within an integrated circuit and/or to re-clock circuits within a DC-DC converter (e.g., PWM circuit, other output circuits, or any combination thereof). FIGS. 3A-B and FIGS. 4A-B provide example comparisons of operation with and without re-clocking of digital circuits. FIGS. 6A-B and 10A-B provide example comparisons of operation without and without re-clocking of DC-DC converter output circuits. FIGS. 7A-7B provide example embodiments for low and high side injection for the embodiment of FIG. 5. FIGS. 9A and 9B provide example embodiments for low and high side injection for the embodiment of FIG. 8 that uses a PLL to center the RF channel. FIG. 11 provides an example process flow for applying re-clocking It is noted that these example embodiments can be used in combination or by themselves as desired, and additional features, different features, or both could also be implemented while still taking advantage of the re-clocking embodiments described herein that use a local oscillator (LO) signal to re-clock digital signals in order to reduce switching interference within the RF channel being received.

FIG. 1 is a block diagram of an integrated circuit 100 including a clock system 122 configured to re-clock digital circuitry to control spurs, in accordance with certain embodiments of the present disclosure. The integrated circuit 100 may include a radio frequency (RF) circuit 102 coupled to an external clock source, such as a crystal oscillator 104. The RF circuit 102 may include an RF front end circuit 106 that may be configured to receive RF signals from a signal source, such as an antenna 108. The RF front end circuit 106 may receive RF signals as well as noise due to digital switching interference. The RF front end circuit 106 may include an input coupled to a clock system 122, an input/output coupled to a controller (such as a microcontroller unit (MCU) 118), and an output coupled to an input of an analog-to-digital converter (ADC) 110. The ADC 110 may include a clock input to receive the external clock signal, a control input/output coupled to the MCU 118, and an output coupled to an input of one or more digital circuits 112. The digital circuits 112 may include a clock input to receive a digital clock having a selected frequency ($f_{DIG}$), which may be the external clock frequency or a re-clocked frequency. The digital circuits 112 may include an input/output coupled to the MCU 118 and may include an output coupled to a power amplifier (PA) 114. The PA 114 may include an input/output coupled to the MCU 118 and may include an output coupled to a transmit antenna 116.

The MCU 118 may include a clock input to receive the digital clock and may include an output coupled to an input/output (I/O) interface 120, which may include one or more general purpose I/Os. The I/O interface 120 may include a clock interface 122 configured to receive the digital clock. The MCU 118 may also be coupled an I/O of the clock system 122 and to an I/O of a DC-DC converter 130. The MCU 118 may also be coupled to a select input of a multiplexer 129 to provide a re-clock control signal.

The clock system 122 may include a radio frequency (RF) synthesizer 124 including a first input to receive a channel signal that selects a channel to be tuned within a receive frequency band, a second input to receive a band signal that selects the receive frequency band of operation, a third input to receive an external clock signal from the crystal oscillator 104, and an output to provide a local clock signal having a local oscillator frequency ($f_{LO}$). It is also noted that if the RF circuit 102 is configured to operate within a single frequency band, the band signal input may be removed. The clock system 122 may further include a clock signal generator 126 including an input coupled to the output of the oscillator, an output coupled to an input of a re-clock circuit 128, and an output coupled to a clock circuit 132 of the DC-DC converter 130. The clock signal generator 126 may include a second output coupled to a PWM circuit 134 of the DC-DC converter 130. The re-clock circuit 128 may include an input coupled to the crystal oscillator 104, an input coupled to at least one of the clock signal generator 126 and the RF synthesizer 124, and an output coupled to a first input of the multiplexer 129, which has a second input coupled to the crystal oscillator 104 to receive the external clock signal. The RF synthesizer 124 may include multiple components and is a circuit that may be configured to provide a periodic timing signal (such as a local oscillator signal) that may have a programmable frequency. Further, as used herein, the terms "first" and "second" with respect to circuit components or inputs and outputs of such components are used to differentiate one from another and are not intended to imply any particular order or arrangement. The multiplexer 129 may include an output to provide the digital clock to one or more circuits.

The DC-DC converter 130 may include a clock circuit 132 configured to receive a clock signal from the clock signal generator 126, which provides the DC-DC operating frequency (such as, for example, an 8 MHz clock signal).

The DC-DC converter 130 may further include a pulse-width-modulator (PWM) circuit 134, which may be coupled to an output of the clock circuit 132 and which receives a signal from the clock signal generator 126 to re-clock the PWM signal (for example, by dividing the local oscillator frequency, e.g., $f_{LO}/4$). The PWM circuit 134 may produce an output signal including a plurality of pulse width modulated pulses that can be used to supply power to associated circuitry. In some embodiments, a capacitor may be coupled to the output of the PWM circuit 134 to store charge, which may be used to supply power to various circuits.

In some embodiments, harmonics from switching of digital circuitry operating within an integrated circuit (e.g., MCU 118, digital processing circuits 112, and other circuitry), circuitry of a direct-current to direct-current (DC-DC) converter 130 operating within the integrated circuit, or any combination thereof may produce noise that can be inductively coupled into the RF front end 106. In some instances, the digital switching interference can be at an RF frequency that is in the RF channel that is selected for tuning. By using a local oscillator (LO)-based signal ($f_{LO}$) from the RF synthesizer 124 to re-clock the digital switching, a spectral null may be placed at or near the RF passband to provide a band-reject filtering effect with respect to spurs by re-clocking digital circuits based on the LO signal from the RF synthesizer 124. By re-clocking one or more of the digital circuits, the inductive noise due to switching harmonics can be filtered or shifted away from the receive frequency. Since the LO signal frequency ($f_{LO}$) will be offset from the center frequency for the RF channel by some intermediate frequency (IF) (which may change for different receive bands), the interfering switching frequencies can essentially be offset from the RF channel as well.

In a receive mode, the MCU 118 may control the multiplexer 129 to provide a re-clocked local oscillator signal to the digital circuits 112, the MCU 118, the clock interface 122 of the I/O circuit 120, the DC-DC converter 130, other circuits, or any combination thereof. In a transmit mode, the MCU 118 may control the multiplexer 129 to provide the external clock signal to the digital circuits 112, the MCU 118, and the clock interface 122.

In some embodiments, the PWM signal from the PWM circuit 134 may be provided to a switch and an inductor, which may be coupled to an output capacitor (such as output capacitor 222 in FIG. 2), which may store charge and provide regulated power to internal circuitry on the chip. The MCU 118 may control the clock signal generator 126 to provide an LO-based clock signal to the clock circuit 132, which may adjust edge timing of transitions within the PWM signal, reduce switching noise in the channel of interest, and reduce escape currents from the external capacitor. In some embodiments, the PWM circuit 134 may produce a PWM signal having pulse transitions that occur on the edges of the LO signal, moving switching interference from the RF channel. In some embodiments, the MCU 118 may determine a receive channel of interest and may control the RF synthesizer 124 to produce the LO signal having a frequency that is offset from the frequency of interest.

In some embodiments, the DC-DC converter 130 may provide power to circuitry of the integrated circuit 100, including digital circuitry, analog circuitry, and radio circuits. The DC-DC converter 130 may utilize a clock source based on the RF synthesizer 124 or may utilize another clock signal, such as a free running oscillator internal to the DC-DC converter 130. In some embodiments, the DC-DC converter 130 may use its own internal clock during certain modes and may utilize the LO-based clock signal from the RF synthesizer 124 during a receive mode. In some embodiments, the digital route (e.g., digital circuits 112) and the DC-DC converter 130 may be re-timed during receive operations, but the digital route may be provided the external clock during transmit operations, while the DC-DC converter 130 may continue to be re-timed using a clock signal based on the LO clock. In some embodiments, at least one of the clock signal and the re-clocked local oscillator signal may be provided to the I/O interface 120. In some embodiments, both the external clock signal and the re-clocked clock signal may be provided to the digital route.

It should be appreciated that the integrated circuit 100 of FIG. 1 represents one possible illustrative example of a circuit in which the re-clocking functionality may be implemented. The re-clocking operation may be implemented using a variety of circuits. In one possible implementation, a flip-flop circuit may be used to re-clock or re-time a clock signal as described below with respect to FIGS. 2A-B.

Figure 2A:
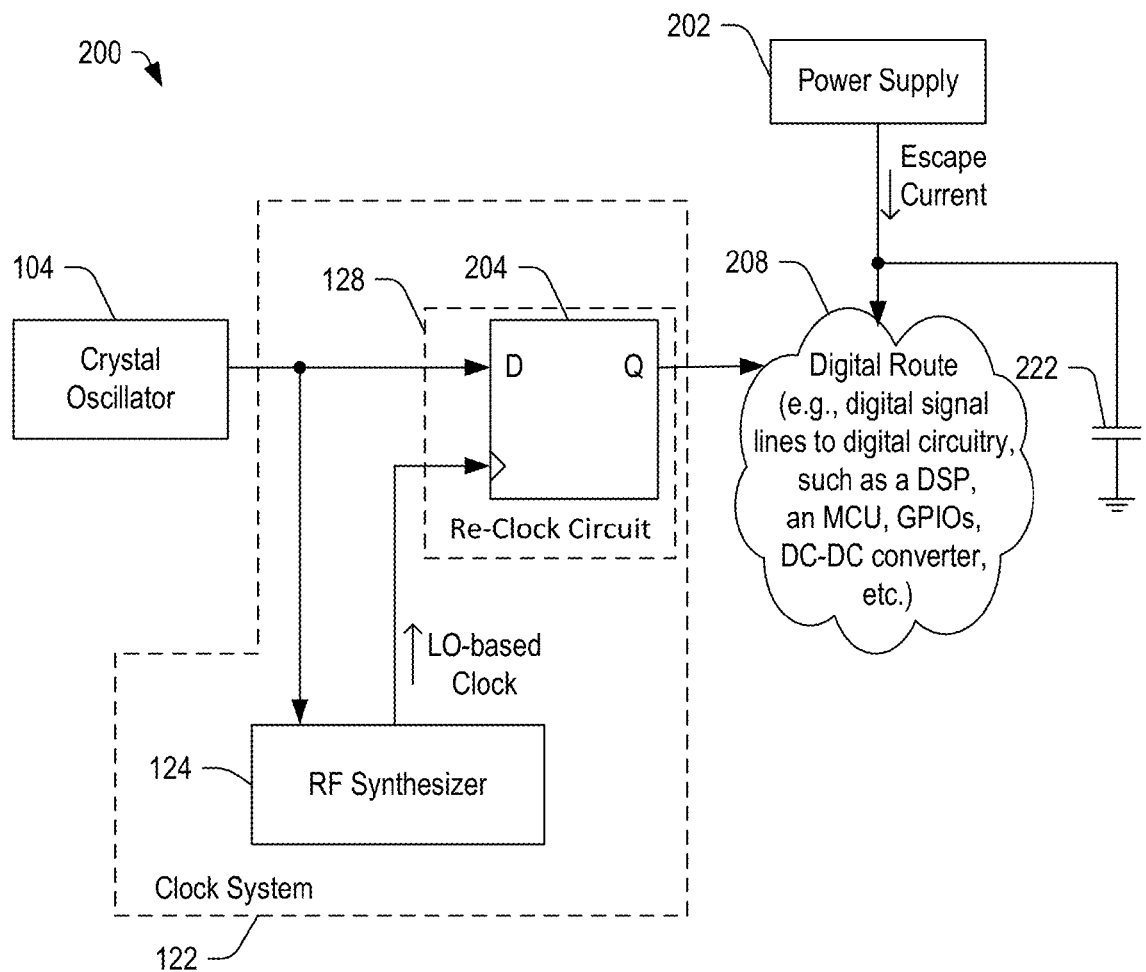
FIG. 2A is a block diagram of an integrated circuit including a clock system configured to provide a re-clocked output signal to a digital route coupled to digital circuitry in order to re-clock the digital circuitry to control spurs, in accordance with certain embodiments of the present disclosure.

FIG. 2A is a block diagram of a system 200 including circuits configured to re-clock digital circuitry to control spurs, in accordance with certain embodiments of the present disclosure. In some embodiments, the system 200 may include the clock system 122. The system 200 may receive a clock signal from the crystal oscillator 104, which may be an external clock source. The crystal oscillator 104 may be coupled to the re-clock circuit 128. In this embodiment, the re-clock circuit 128 may include an edge-triggered Flip-Flop (FF) circuit 204, which includes a data input coupled to the crystal oscillator 104. The clock system 122 may also include the RF synthesizer 124, which may be configured to provide a local oscillator-based signal (LO-based clock) to a clock input of the FF circuit 204. In an alternative implementation, the RF synthesizer 124 may be replaced with a different timing circuit, such as a programmable local oscillator circuit or another type of circuit configurable to produce a timing signal at a selected frequency. The FF circuit 204 may include an output coupled to a digital route 208, which may represent digital signal lines to one or more digital circuits (e.g., a digital signal processor, a microcontroller unit (MCU), general purpose input/outputs (I/Os), the DC-DC converter, other digital circuits, or any combination thereof). The switching activity of the digital route 208 may generate escape currents from a supply de-coupling capacitor, such as the capacitor 222.

In some embodiments, the RF synthesizer 124 may produce a local oscillator (LO) signal based on a selected RF channel and may provide the LO signal to the clock input of the FF circuit 204. The LO signal may be selected by a controller (such as the MCU 118 in FIG. 1 or another control circuit (not shown)) to have a frequency that is offset from a frequency of interest, such as a tuned frequency. In response to the LO signal, the FF circuit 204 may re-clock the clock signal from the crystal oscillator 104 based on the LO signal, which re-clocking may place a null with respect to spur energy at or near the selected RF frequency, thereby increasing the signal-to-noise ratio at the selected frequency.

In an example, the crystal oscillator 104 may provide a clock signal having a frequency of approximately 38.4 MHz. In some embodiments, the RF synthesizer 124 may provide an LO signal to the clock input of the FF circuit 204, which LO signal may directly track the frequency of the desired receive signal or that is a fraction of the LO frequency used to down-convert the desired receive signal. The LO signal may be used to resample any clock signal within the chip or system. The LO-derived clock may define timing instants at which at least some of the low frequency clocks can transition, adjusting chip timing to timing transitions that correspond to the LO transitions.

In some embodiments, the RF synthesizer 124 (or another local oscillator) may be utilized at a chip level to place timing of the digital logic route according LO signal. In some embodiments, the LO signal may be used to restrict timing of the general purpose I/Os, such that the general purpose I/Os may change state on edges defined by the LO signal's timing. In some embodiments, the LO signal or a divided version of the LO signal may be used to control timing of an analog DC-DC converter (such as the DC-DC converter 130 in FIG. 1) that generates pulse-width modulated (PWM) signals to regulate the chip voltage. The PWM average width may be set by the DC-DC converter 130, but the instantaneous start and stop times of the PWM signal may be controlled or quantized according to the timing of transitions defined by the LO signal. The LO signal may be used to resample clock signals to place spectral nulls at or near the frequency of interest (i.e., a selected channel frequency).

Figure 2B:
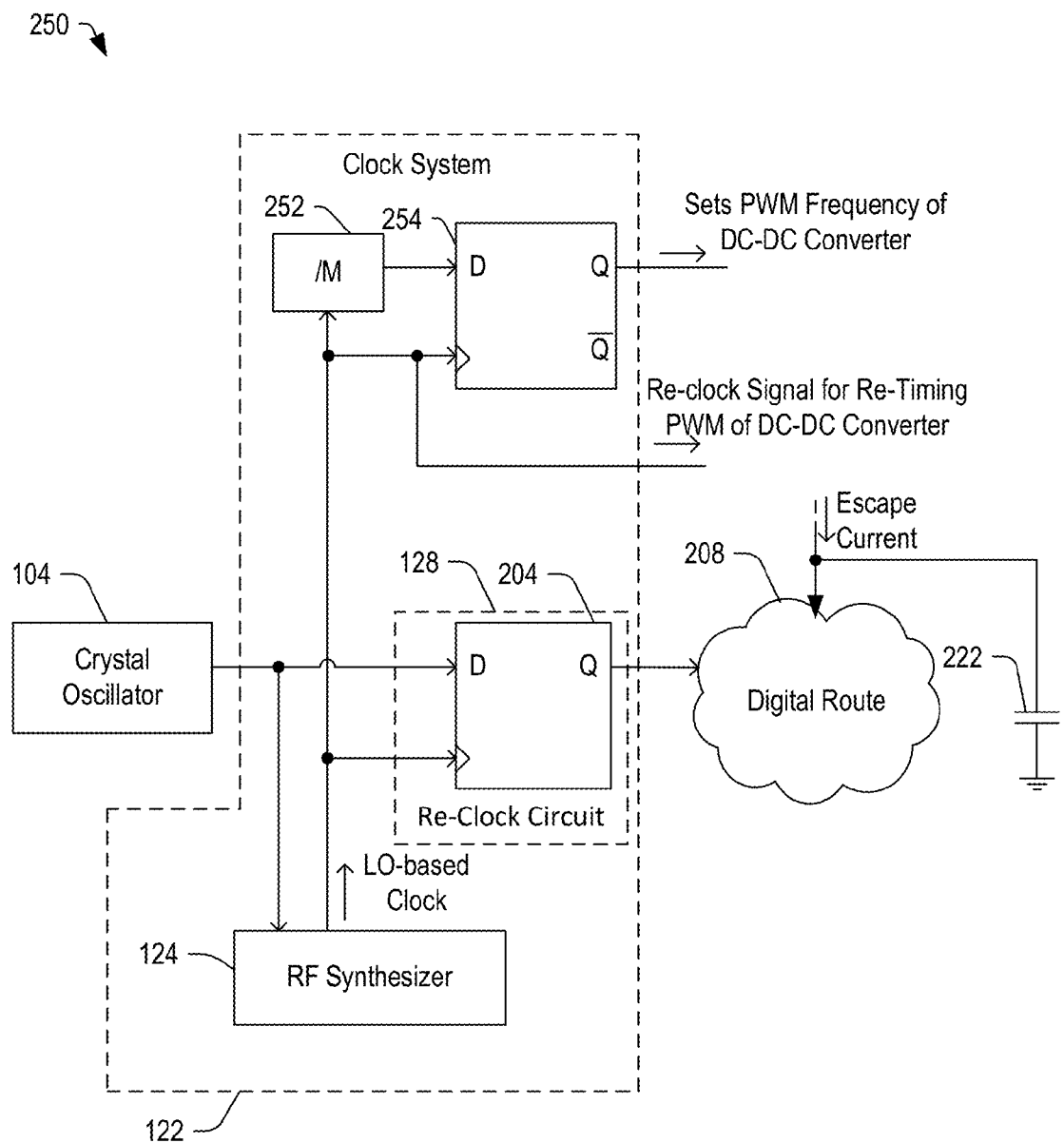
FIG. 2B is a block diagram of an integrated circuit including a clock system configured to provide a re-clocked output signal to a digital route and to provide re-clocked output signals to a direct-current (DC)-DC converter, in accordance with certain embodiments.

FIG. 2B is a block diagram of a circuit 250 including a clock system 122 configured to provide a re-clocked output signal to the digital route 208 and to provide re-clocked output signals to the DC-DC converter 130, in accordance with certain embodiments. The circuit 250 includes the RF synthesizer 124 (or which may include a local oscillator) and the re-clock circuit 128. In this embodiment, the circuit 250 may further include a FF circuit 254 including a data input coupled to the output of the divide by M circuit, 252, which is coupled to the output of the RF synthesizer 124. FF circuit 254 provides an output to set the DC-DC PWM frequency to be a sub-multiple of the LO frequency. A clock input is coupled to the RF synthesizer 124, and an output to provide a re-clock signal to re-clock the PWM signal of the DC-DC converter 130.

Figure 3A:
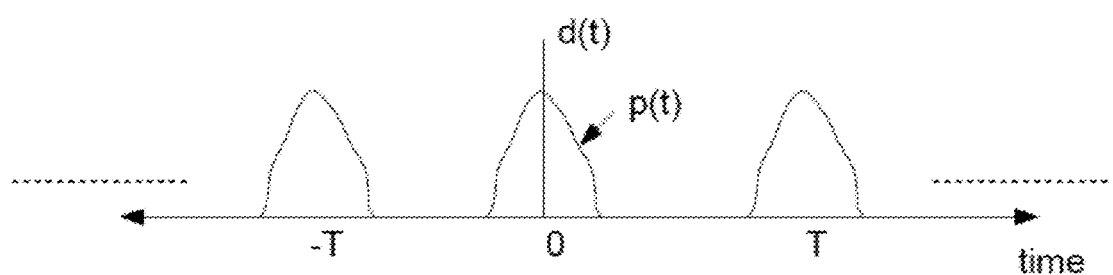
FIG. 3A is a graph of a periodic signal versus time depicting several signal pulses.

FIG. 3A is a graph 300 of a periodic signal versus time depicting several signal pulses. For the purpose of illustration, the pulse p(t) is centered at time (0), at time (−T), at time (+T), and intervals (T±nT). where the variable (n) is an integer. The periodicity of the pulses (p(t)) may produce periodic spurs in the frequency spectrum. In particular, the transition edges cause switching interference, which can be inductively coupled into the RF channel.

Figure 3B:
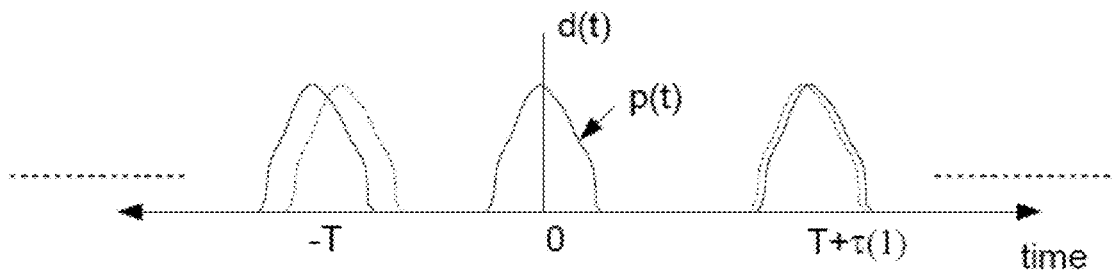
FIG. 3B is a graph of a re-clocked version of the signal of FIG. 3A versus time according to certain embodiments.

FIG. 3B is a graph 310 of a re-clocked version of the signal of FIG. 3A versus time according to certain embodiments. The graph 310 shows that re-clocking leaves the pulse (p(t)) centered at time (0), but that the other periodic pulses may have shifted edges that may be offset relative to the period (T). The periodic pulse stream (d(t)) may be determined according to the following equation:

$$d(t) = \Sigma_{n=-\infty}^{\infty} p(t - nT - \tau(n)) \quad (1)$$

In the frequency spectrum, the frequency response (D(jω)) of the pulses may be determined according to the following equation:

$$D(j\omega) = \Sigma_{n=-\infty}^{\infty} P(j\omega) e^{-j\omega nT} e^{-j\omega \tau(n)} = P(j\omega) \Sigma_{n=-\infty}^{\infty} e^{-j\omega nT} e^{-j\omega \tau(n)} \quad (2)$$

Equation 2 may be simplified according to the following equation:

$$D(j\omega) = P(j\omega) 2 [\Sigma_{n=-\infty}^{\infty} \cos(\omega n(T + \tau(n)))] \quad (3)$$

As shown, creating a repetitive sequence can change filtering of the pulse's Fourier Transform in the frequency domain. By resampling with a non-integer clock signal, it is possible to shift the pulses in time without affecting the average clock frequency, shifting switching noise away from the pulse frequency. For example, the period of a low frequency clock signal ($T_1$) may be (1/38.4 MHz) and the period of a high frequency resampling clock signal ($T_2$) may be (1/600 MHz). The repetitive sequence ($\tau(n)$) may be determined according to the following equation:

$$\tau(n) = T_1 - \frac{T_2}{n} \text{ floor}\left(\frac{nT_1}{T_2}\right) \qquad (4)$$

In the graph 310 in FIG. 3B, it should be appreciated that the average time period of the signal remains unchanged, though the instantaneous timing of transition edges within the sequence may vary from pulse to pulse according to the re-clock frequency timing.

Figure 4A:
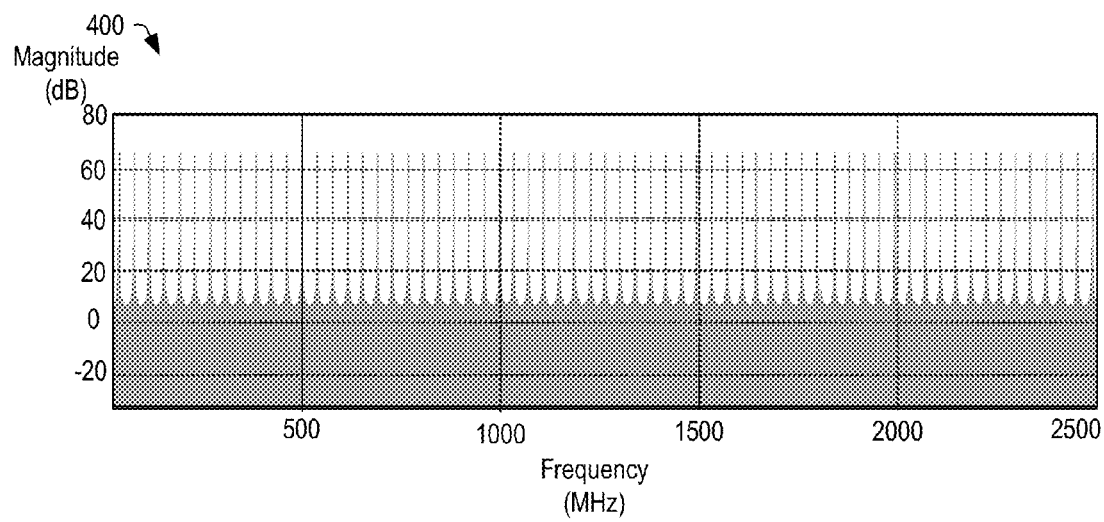
FIG. 4A is a graph of the escape current in decibels (dB) versus frequency (MHz) of a current within the digital route of the system of FIGS. 2A-B assuming uniform logic activity, periodic clock pulses, in accordance with certain embodiments of the present disclosure.

FIG. 4A is a graph 400 of the current magnitude in decibels (dB) versus frequency (in MHz) of an escape current within the digital route of the system of FIGS. 2A-B assuming uniform, periodic clock pulses, in accordance with certain embodiments of the present disclosure. The graph 400 shows the frequency spectrum of the escape current of the digital logic circuitry without resampling. The graph 400 illustrates that the spurs occur at regular frequency intervals and that the spurs are substantially uniform in amplitude.

Figure 4B:
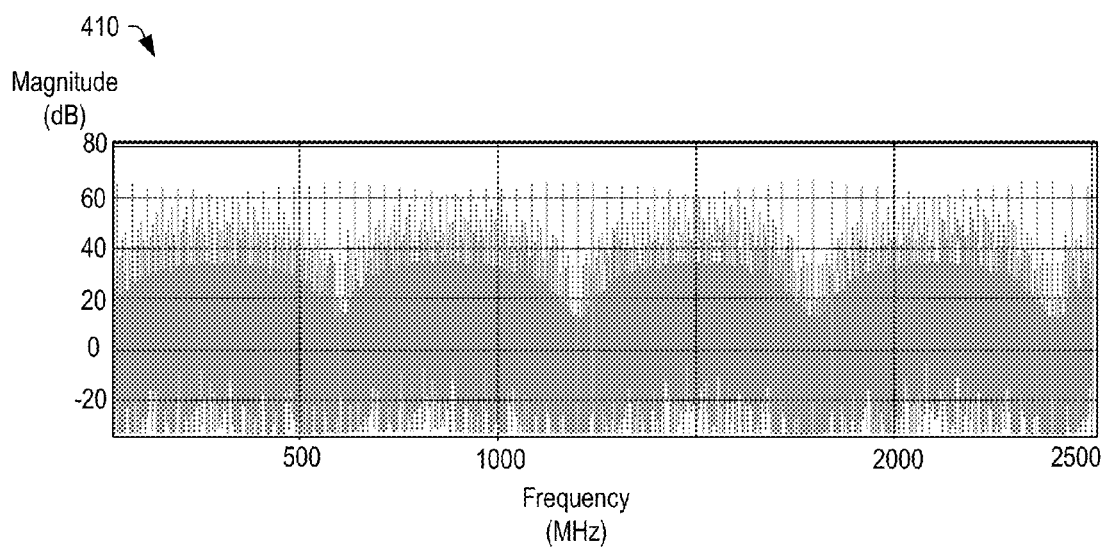
FIG. 4B is a graph of the escape current (dB) versus frequency (MHz) of a current within the digital route of the system of FIG. 1 assuming a resampled clock pulses, in accordance with certain embodiments of the present disclosure.

FIG. 4B is a graph 410 of the escape current (in dB) versus frequency (in MHz) of a current within the digital route of the system of FIGS. 2A-B with uniform logic activity and assuming a resampled clock pulses, in accordance with certain embodiments of the present disclosure. In graph 410, the resampling clock has a frequency of approximately 600 MHz, providing a null at 600 MHz and its harmonics. Further, unlike the spurs in the graph 400, the magnitudes of the spurs in the graph 410 vary.

By re-clocking the crystal oscillator signal at a selected local oscillator frequency, a spectral null may be introduced at or near the resampling clock frequency and its harmonics to reduce interference at the selected frequency. It should be appreciated that, while the above example uses a 600 MHz resampling clock, the frequency of the resampling clock may be selected to place the spectral null at a desired (selected) frequency.

Figure 5:
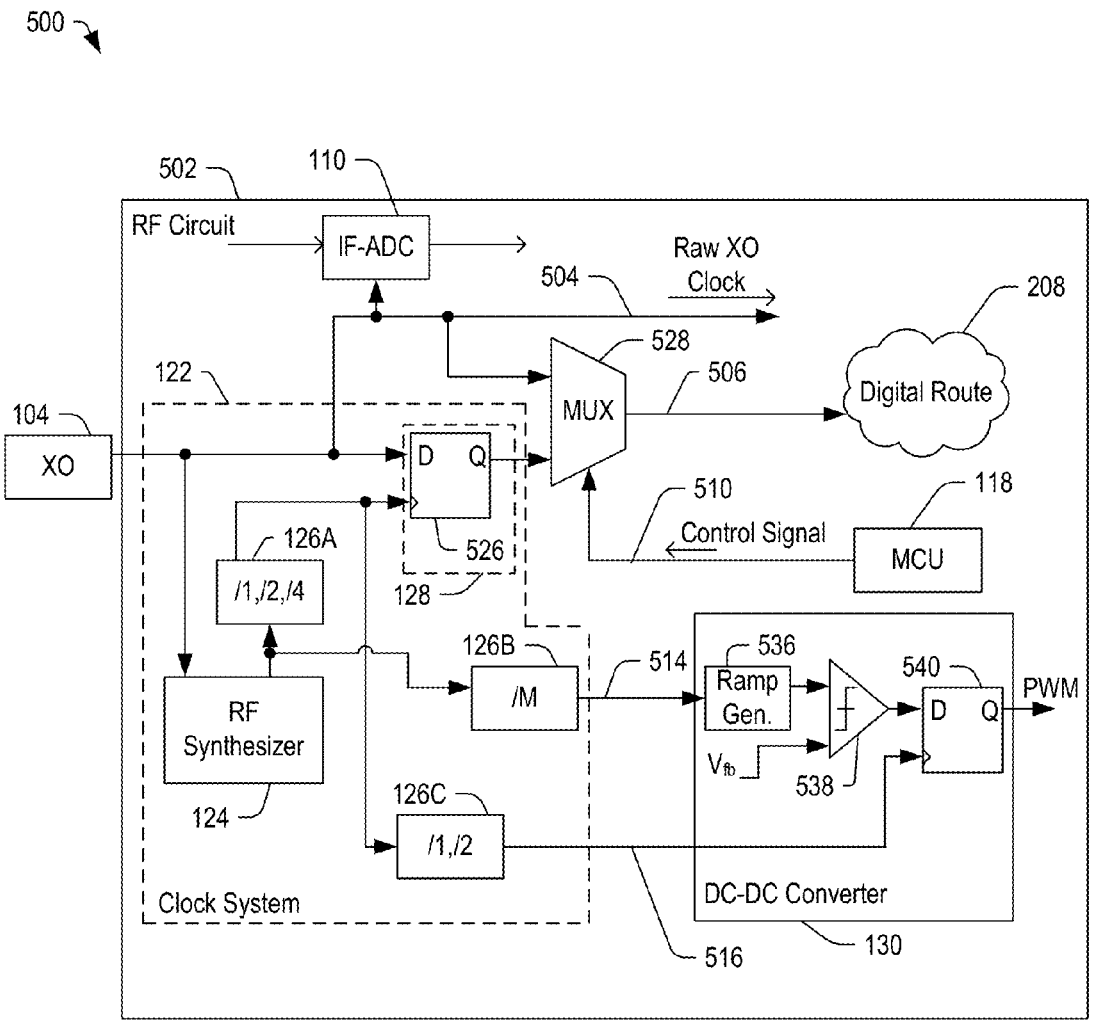
FIG. 5 is a block diagram of a system including a radio frequency circuit configured to selectively re-clock one or more output signals, in accordance with certain embodiments of the present disclosure.

FIG. 5 is a block diagram of a system 500 including re-clocking circuitry, in accordance with certain embodiments. The system 500 may include an RF circuit 502 coupled to a crystal oscillator 104, which is configured to provide a clock signal to a node 504. The RF circuit 502 may include the clock system 122 coupled to the node 504. The RF circuit 502 may also include an intermediate frequency (IF) analog-to-digital converter (ADC) 110 including an input to receive a signal, a clock input coupled to the node 504, and an output to provide a sampled digital signal. The RF circuit 502 may further include the re-clock circuit 128, a multiplexer 528, the digital route 208 (e.g., conductive traces configured to provide timing signals to associated digital circuitry), the MCU 118, and the DC-DC converter 130.

The clock system 122 includes the RF synthesizer 124, the re-clock circuit 128, and the clock signal generator 126, which may be implemented as multiple frequency divider circuits (126A, 126B, and 126C). The RF synthesizer 124 includes an input coupled to the node 504 and includes an output coupled to an input of a frequency divider circuit 126A and to an input of a frequency divider circuit 126B. The frequency divider circuit 126A may be an integer divider circuit that includes an output coupled to a clock input of an FF circuit 526, which is part of the re-clock circuit 128. The FF circuit 526 may further include an input coupled to the node 504 and an output coupled to an input of the multiplexer 528. The multiplexer 528 may include the input coupled to the output of the FF circuit 526, an input coupled to the node 504, and an output coupled to a node 506. The multiplexer 528 may further include a control input configured to receive a control signal from the MCU 118. In response to the control signal, the multiplexer 528 may selectively provide one of the raw XO clock signal from the node 504 and a local timing output signal (representing a re-timed version of the raw XO clock signal) from the output of the re-clock circuit 128 to the digital route 208 via the node 506.

The clock system 122 may further include the frequency divider circuit 126B including an input coupled to the output of the frequency synthesizer 124. The frequency divider circuit 126B may be an integer divider configured to divide the local oscillator signal and to provide the divided local oscillator signal to a node 514. The clock system 122 may also include a frequency divider circuit 126C, which may include an input coupled to the output of the frequency divider circuit 126A and which may include an output coupled to a node 516. The frequency divider circuit 126C may be an integer divider circuit.

In some embodiments, the DC-DC converter 130 may include a ramp generator 536 having an input coupled to the node 514 and including an output coupled to a first input of a comparator 538. The comparator 538 may include a second input to receive a voltage, such as a reference voltage, a feedback voltage or another selected voltage, and may include an output coupled to an input of a FF 540. The FF 540 may include a second input coupled to the node 516 to receive a local timing output signal from the frequency divider circuit 126C and may include an output to provide a pulse width modulated (PWM) signal. The DC-DC converter 130 may receive a first local timing signal from the node 514 and a second local timing signal from the node 516 and may provide the PWM signal at an output that has PWM start and stop times (rising edge transitions and falling edge transitions) that are quantized in time to transitions within a local oscillator (LO) signal from the RF synthesizer 124 or within the local output timing signal from the frequency divider circuit 126C.

In some embodiments, during a transmit operation (in transmit mode), the MCU 118 may control the multiplexer 528 to provide the raw XO clock to the digital route 208. In some embodiments, the RF circuit 502 does not re-time the digital route 208 during a transmit mode in order to avoid introducing output spurs in the transmitted signal. However, during a transmit mode, the RF circuit 502 may re-time the DC-DC converter 130, other digital circuits, or any combination thereof.

During a receive operation (in receive mode), the MCU 118 may control the multiplexer 528 to provide the re-timed clock signal to the digital route 208 to reduce switching noise in the receive channel. Further, the frequency of the local clock used to re-time the raw XO clock via the FF circuit 526 may be selected based on the frequency of the channel of interest. The local clock provided to the clock input of the FF circuit 526 forces the transitions of the raw XO clock signal to be re-timed to occur in synchronization with the transition edges of the LO-based signal. Further, the re-timing of the DC-DC converter 130 forces the transitions of the PWM signal produced by the DC-DC converter 130 to occur with the transition edges of the clock signal provided at the node 516, which may be an integer divided version of the local clock signal provided by the RF synthesizer 124 (or another clock source).

In some embodiments, it may be desirable to adjust the frequency of the crystal oscillator 104 when using different transmit and receive bands. This strategy may be effective for direct coupling of the crystal oscillator 104 to a low noise amplifier (LNA) in narrowband systems. Retiming of the raw XO clock signal can attenuate RF spurs by more than 25 dB in some instances, but can create new spurs at other frequencies. In some embodiments, the controller (MCU 118) may activate and de-activate retiming using the multiplexer 528 to select between the raw XO clock signal and the local timing output signal as the system 500 switches to different channels (different frequencies of interest) or the RF synthesizer 124 may change the retiming frequency in response to control signals from the controller (MCU 118) via control lines (not shown) or from another signal source (not shown).

In some embodiments, the RF synthesizer 124 (or another programmable local clock generator) may be programmed to produce a local oscillator (LO) signal having a frequency that corresponds to a frequency of interest (such as a receive frequency or transmit frequency). The LO signal may be provided to frequency divider circuits 126A and 126B, which may divide the LO signal by a selected integer to produce local timing signals. A first local timing signal may be provided by the frequency divider circuit 126A to a clock input of a FF circuit 526, which may re-clock the raw XO clock using the first local timing signal to produce a local timing output signal, which may be provided to the second input of the multiplexer 528. A second local timing signal may be provided by the frequency divider circuit 126B to the ramp generator 536 of the DC-DC converter 130. A third local timing signal may be generated by the frequency divider circuit 126C based on the first local timing signal and may be provided to the clock input of the FF circuit 540 of the DC-DC converter 130.

In some embodiments, the DC-DC converter 130 may be clocked such that the frequency of the DC-DC converter 130 is made to track the frequency of the LO signal, such that the DC-DC operating frequency is a sub-harmonic of the LO signal, which may be at or near the frequency of interest. The local timing signals may be used to adjust the operating frequency of the DC-DC converter 130 such that the DC-DC harmonics fall outside of the RF receive band.

Figure 6A:
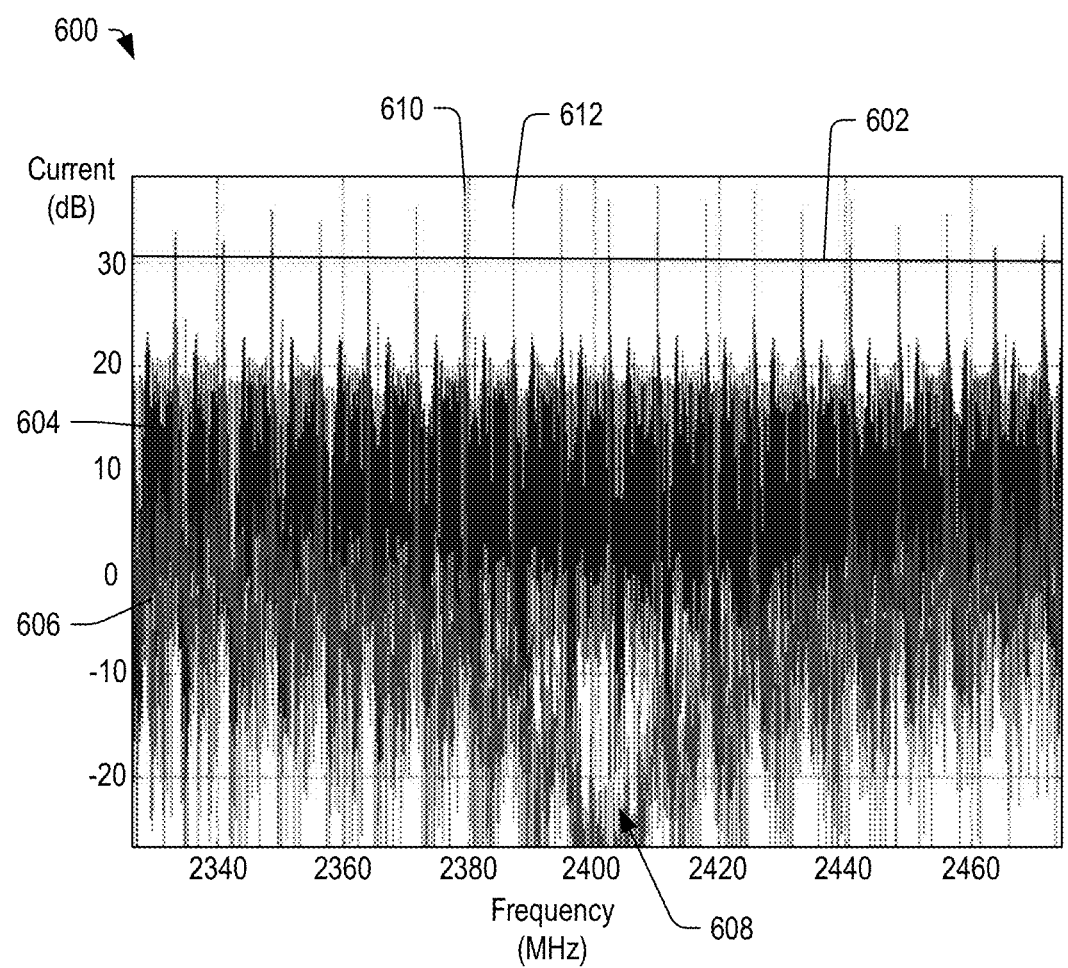
FIG. 6A is a graph of the spectral density resulting from an idealized pulse-width modulated (PWM) escape current waveform and a re-clocked version of the PWM escape current waveform, in accordance with certain embodiments
Figure 7A:
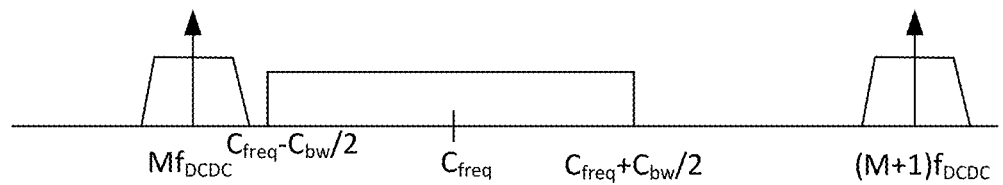
FIG. 7A is a frequency spectrum diagram of the Nth and (N+1)th harmonics of the DC-DC converter escape current of the circuit of FIG. 5 with spectral spreading shown around the desired receive channel frequency band, but offset in frequency, using low-side injection, in accordance with certain embodiments of the disclosure.
Figure 7B:
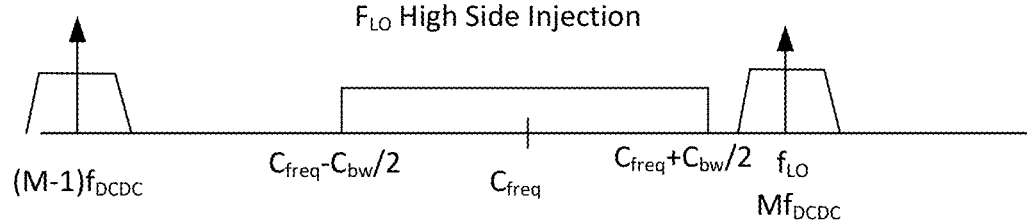
FIG. 7B is a frequency spectrum diagram of the Nth and (N+1)th harmonics of the DC-DC converter escape current of the circuit of FIG. 5 with spectral spreading shown around the desired receive channel frequency band, but offset in frequency, using high-side injection, in accordance with certain embodiments of the disclosure.

FIG. 6A is a graph 600 of current magnitude (dB) versus frequency (MHz) for DC-DC escape currents for an idealized PWM waveform and 5% sinusoidal variation in load current at 134 kHz rate without and with local oscillator based resampling or re-clocking of the PWM waveform at 600 MHz, in accordance with certain embodiments. The graph 600 assumes a 10 mA average load current for the DC-DC converter and a 10 pH mutual inductance from the DC-DC converter to the sub-GHz receiver inputs and to the 2.4 GHz receiver inputs and with a fixed PWM pulse start time. The graph 600 includes a first spectrum 604 resulting from DC-DC converter switching without re-clocking of the clock signal. The graph 600 further includes a second spectrum 606 resulting from the DC-DC converter switching using a local oscillator clock with re-clocking at 600 MHz. Further, the graph 600 depicts a spur limit at approximately 30 dB, which provides approximately a 5 dB margin in the 2.4 GHz band, when retiming is not used.

In the graph 600, the spurs 610 and 612 in the re-sampled spectrum 606 are spaced apart by approximately 7.68 MHz, and the re-sampled spectrum 606 produces a notch or null 608 at approximately 2404 MHz. The notch 608 is more clearly depicted in FIG. 6B in which the spectrum 604 is omitted and only the spectrum 606 is shown.

Figure 6B:
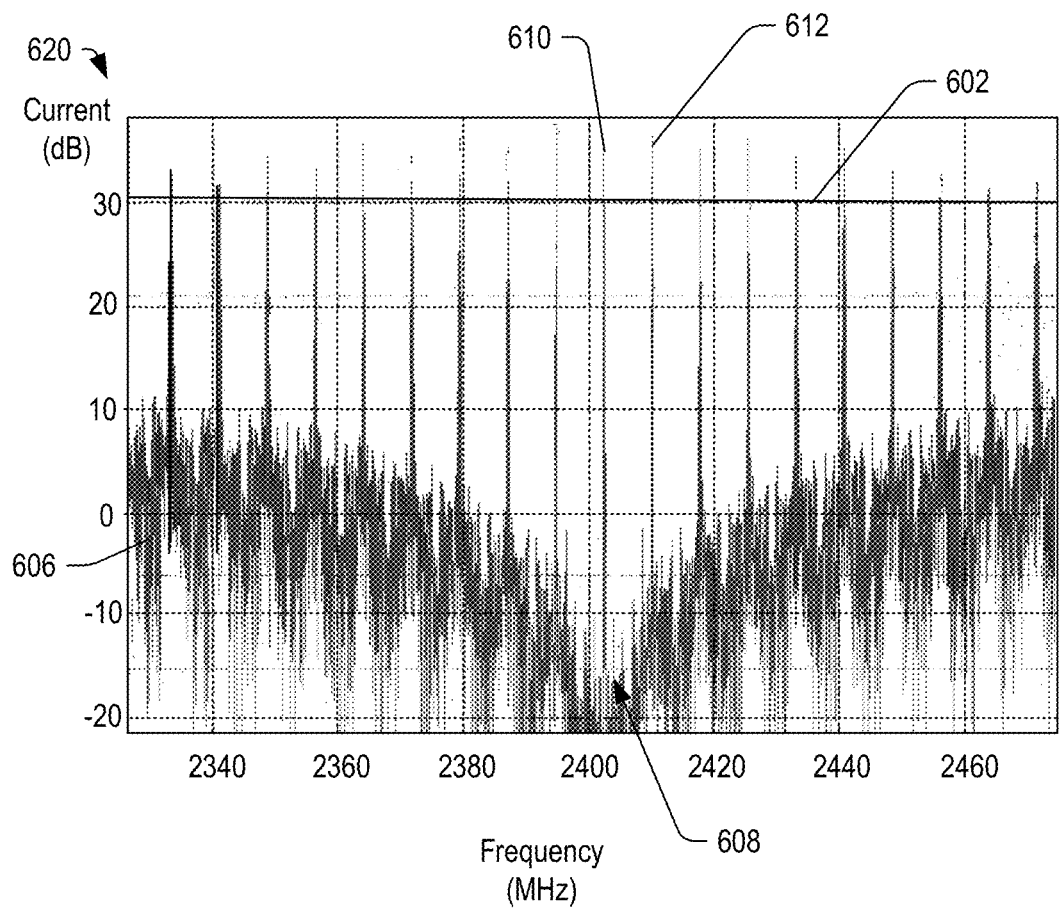
FIG. 6B is a graph of the spectral density resulting from re-clocking of the PWM escape current waveform in accordance with certain embodiments of the present disclosure.

FIG. 6B is a graph 620 of the current versus frequency for DC-DC escape currents for an idealized PWM waveform and 5% sinusoidal variation in load current at 134 kHz rate resampled at 600 MHz, in accordance with certain embodiments. As shown, the notch 608 is formed in the spectrum 606 at approximately 2404 MHz, and the spurs 610 and 612 are separated by 7.68 MHz. The spectrum 606 for the re-clocked escape currents provides enhanced signal-to-noise ratio relative to the spur limit 602 in the 2.4 GHz band.

In the above-examples, the RF synthesizer 124 can provide an LO signal having a selected frequency. However, in some embodiments, the local oscillator signal or the output of the RF synthesizer may be further divided to provide different LO signals to various components, such as during the RF receive operations, shifting spectral energy that might otherwise induce noise in the receive channel to frequencies outside of the channel of interest.

FIG. 7A is a frequency spectrum diagram 700 of the Mth and (M+1)th harmonics of the DC-DC converter escape current with spectral spreading shown around the desired receive channel frequency band, but offset in frequency, using low-side injection, in accordance with certain embodiments. Dividing the local oscillator frequency by an integer, M, in the frequency divider circuit 126B of FIG. 5, causes the Mth harmonic of the DC-DC converter 130 to coincide with the frequency of the RF synthesizer 124 and the (M+1)st harmonic to be above the frequency of the RF synthesizer 124 by the switching frequency of the DC-DC converter 130 (e.g. 8 MHz). Re-timing the PWM signal via the FF circuit 540 with a divided value of the oscillator signal from the RF synthesizer 124 from the frequency divider 126C in FIG. 5 attenuates the spectral spreading around the local oscillator frequency, which is closest to the low side of the receive band, in this embodiment.

FIG. 7B is a frequency spectrum diagram 720 of the Mth and (M−1)th harmonics of the DC-DC converter escape current with spectral spreading shown around the desired receive channel frequency band, but offset in frequency, using high-side injection, in accordance with certain embodiments. Dividing the local oscillator frequency by an integer, M, in the frequency divider circuit 126B in FIG. 5, causes the Mth harmonic of the DC-DC converter 130 to coincide with the frequency of the RF synthesizer 124 and the (M−1)th harmonic to be below the frequency of the RF synthesizer 124 by the switching frequency of the DC-DC converter 130 (e.g. 8 MHz). Re-timing the PWM signal via the FF circuit 540 with a divided value of the timing signal of the RF synthesizer 124 from the frequency divider 126C in FIG. 6 attenuates the spectral spreading around the local oscillator frequency, which is closest to the high side of the receive band, in this embodiment.

In some embodiments, it may be desirable to use the local timing output signal produced by the re-sampling or re-clocking method when the circuit is in a receive mode and to use the raw XO clock signal when the circuit is in a transmit mode. In the embodiments of systems 100, 200, and 500 of FIGS. 1, 2, and 3, the re-timed clock may be selectively used based on the operating mode of the circuit. In some embodiments, the MCU 118 may select between the XO clock signal and the local timing output signal by controlling a multiplexer to provide the selected output clock signal. In some embodiments, the MCU 118 may also control the frequency of the RF synthesizer 124 to provide a selected clock frequency, which may correspond to a frequency of interest or channel of interest in a received RF signal.

In some embodiments, the operating frequency of the DC-DC converter 130 may be adjusted such that the Nth and (N+1)st harmonics are centered around the desired receive channel to reduce interference. In an example, if the target frequency of the DC-DC converter 130 is approximately 8 MHz, the local integer division ratio of the frequency divider 126B may be designed to keep the DC-DC switching frequency near 8 MHz and typically within 1% as the RF channel frequency changes, but the harmonics are not exactly centered around the receive channel. In an embodiment, the frequency of the DC-DC converter 130 may be determined by a programmable phase locked loop (PLL) circuit to effectively yield the equivalent of a fractional divide value, M. The PLL circuit may have an output frequency (the DC-DC operational frequency) that can be configured to track the LO frequency. An example of a PLL circuit implementation is described below with respect to FIG. 8.

Figure 8:
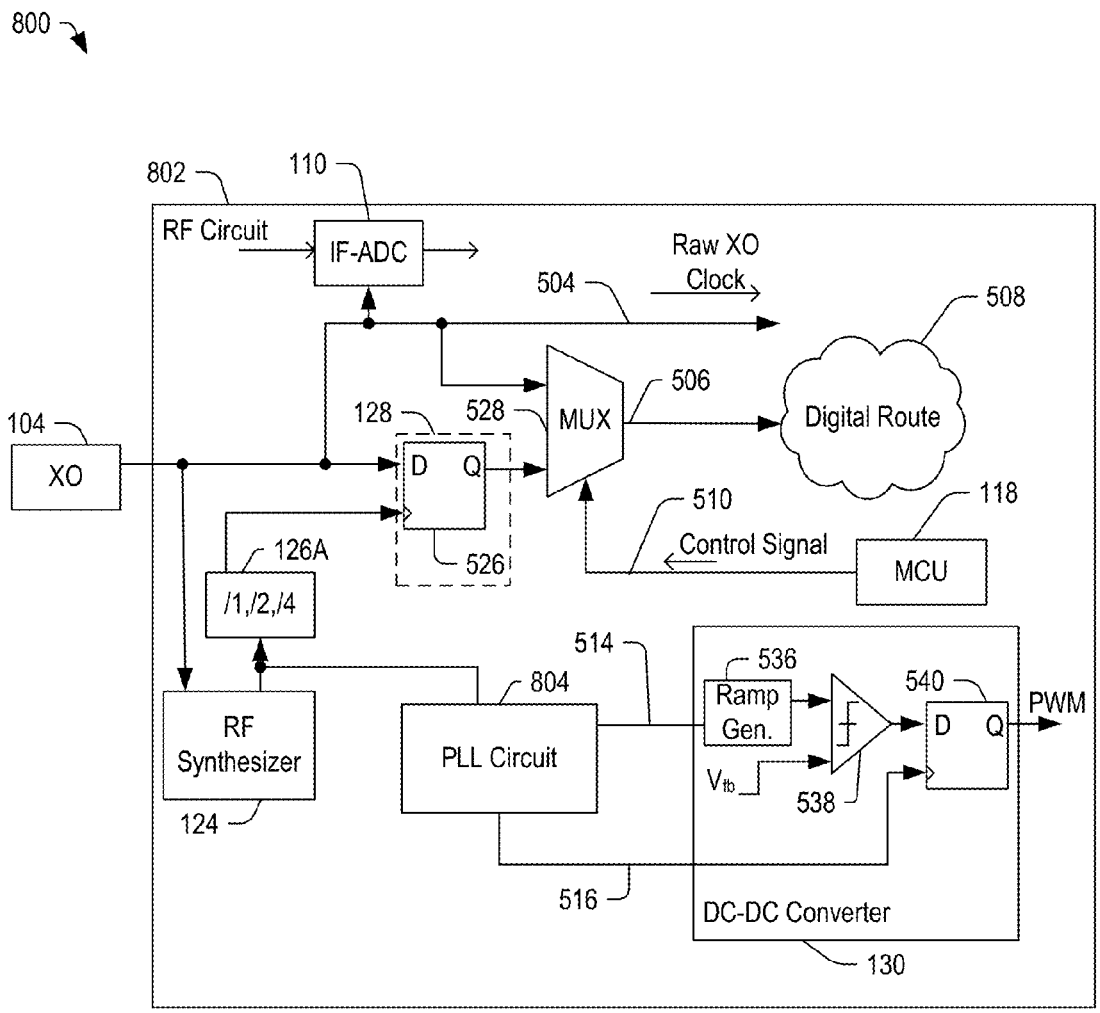
FIG. 8 is a block diagram of a system including a radio frequency circuit configured to selectively re-clock one or more output signals, in accordance with certain embodiments of the present disclosure.
Figure 9A:
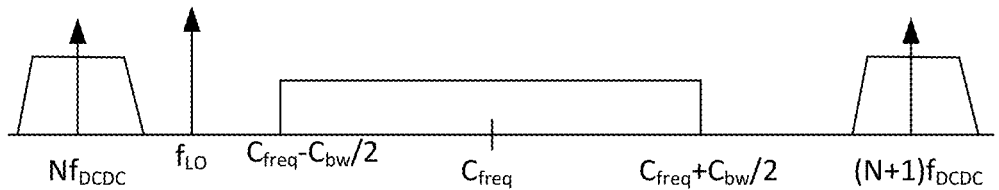
FIG. 9A is a frequency spectrum diagram of the Nth and (N+1)th harmonics of a direct current (DC) to DC (DC-DC) converter escape current of the system of FIG. 8 with spectral spreading shown centered around the desired receive channel frequency band (low side injection), in accordance with certain embodiments of the disclosure.
Figure 9B:
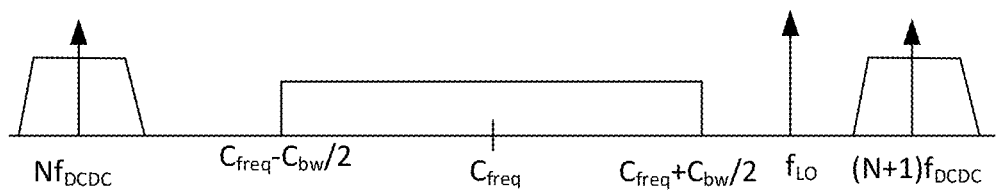
FIG. 9B is a frequency spectrum diagram of the Nth and (N+1)th harmonics of the DC-DC converter escape current of the system of FIG. 8 with spectral spreading shown centered around the desired receive channel frequency band (high side injection), in accordance with certain embodiments of the disclosure.

FIG. 8 is a block diagram of a system 800 including re-clocking circuitry, in accordance with certain embodiments. The system 800 includes all of the elements of the system 500 in FIG. 5, except that the frequency divider circuits 126B and 126C are replaced with a programmable PLL circuit 804, which may include a first output coupled to the node 514 and a second output coupled to the node 516. The PLL circuit 804 may include one or more inputs (not shown) to receive control signals from a controller, such as the MCU 118, a tuner circuit (not shown), or some other circuit to program the frequencies. The PLL circuit 804 may phase lock to a frequency of interest and may control the timing signal provided to the DC-DC converter 130 to force the transition edges of the PWM signal at the output to match the transition timing of the signal provided by the PLL circuit 804. As discussed above, by re-timing the DC-DC converter 130, switching noise may be shifted away from the frequency of interest. It should be appreciated that the selection of the local oscillator frequency provided by the RF synthesizer 124 may be based on the shift produced by the selected frequency.

FIG. 9A is a frequency spectrum diagram 900 of the Nth and (N+1)th harmonics of the DC-DC converter escape current with spectral spreading shown centered around the desired receive channel frequency band. Centering of the DC-DC converter harmonics can be achieved with a fractional divide of the local oscillator frequency using low-side injection, in accordance with certain embodiments, or can be achieved using the PLL circuit 804 in FIG. 8, for example. By providing a timing signal having a relatively high frequency (such as 8.0 MHz) to a DC-DC converter 130, in an idealized system, the escape current energy would be shifted from the receive band center frequency by plus or minus half the DC-DC converter frequency. Re-timing the PWM signal via the FF circuit 540 with a timing signal provided by the PLL circuit 804 in FIG. 8 may attenuate the spectral spreading around the frequency of the timing signal, which may be selected to be closest to the low side of the receive band. Similarly, the high side injection may impact the escape current spectrum as shown in FIG. 9B, in certain embodiments.

FIG. 9B is a frequency spectrum diagram 920 of the Nth and (N+1)th harmonics of the DC-DC converter escape current with spectral spreading shown centered around the desired receive channel frequency band. Centering of the DC-DC converter harmonics can be achieved with a fractional divide of the local oscillator frequency or using the PLL circuit 804 in FIG. 8 using high-side injection, in accordance with certain embodiments. By providing a timing signal having a relatively high frequency (such as 8.0 MHz) to a DC-DC converter 130, in an idealized system, the escape current energy would be shifted from the receive band center frequency by plus or minus half the DC-DC converter frequency. Re-timing the PWM signal via the FF circuit 540 with a timing signal from the PLL circuit 804 in FIG. 8 may attenuate the spectral spreading around the local oscillator frequency which is closest to the high side of the receive band, in this embodiment.

In some embodiments, the RF synthesizer, the clock signal generator 126A, and the PLL circuit 804 may cooperate to provide local timing signals configured to center the Nth and N+1$^{st}$ harmonics of the DC-DC converter 130 around a selected center frequency, such as the center frequency of the low noise amplifier, but the harmonics may not be exactly centered around the receive channel. In general, the frequency dividers 126A-C in FIG. 5 may cycle between one or more integer division ratios to achieve a fractional division M. Such an embodiment may not be preferred, since additional spectral spreading may sometimes occur. For a fractional division M, the PLL 804 in FIG. 8 may be used to avoid such additional spectral spreading. Centering the harmonics around the selected center frequency may allow for maximum spreading of the spectrum due to variable pulse width modulation in the DC-DC converter 130.

Figure 10A:
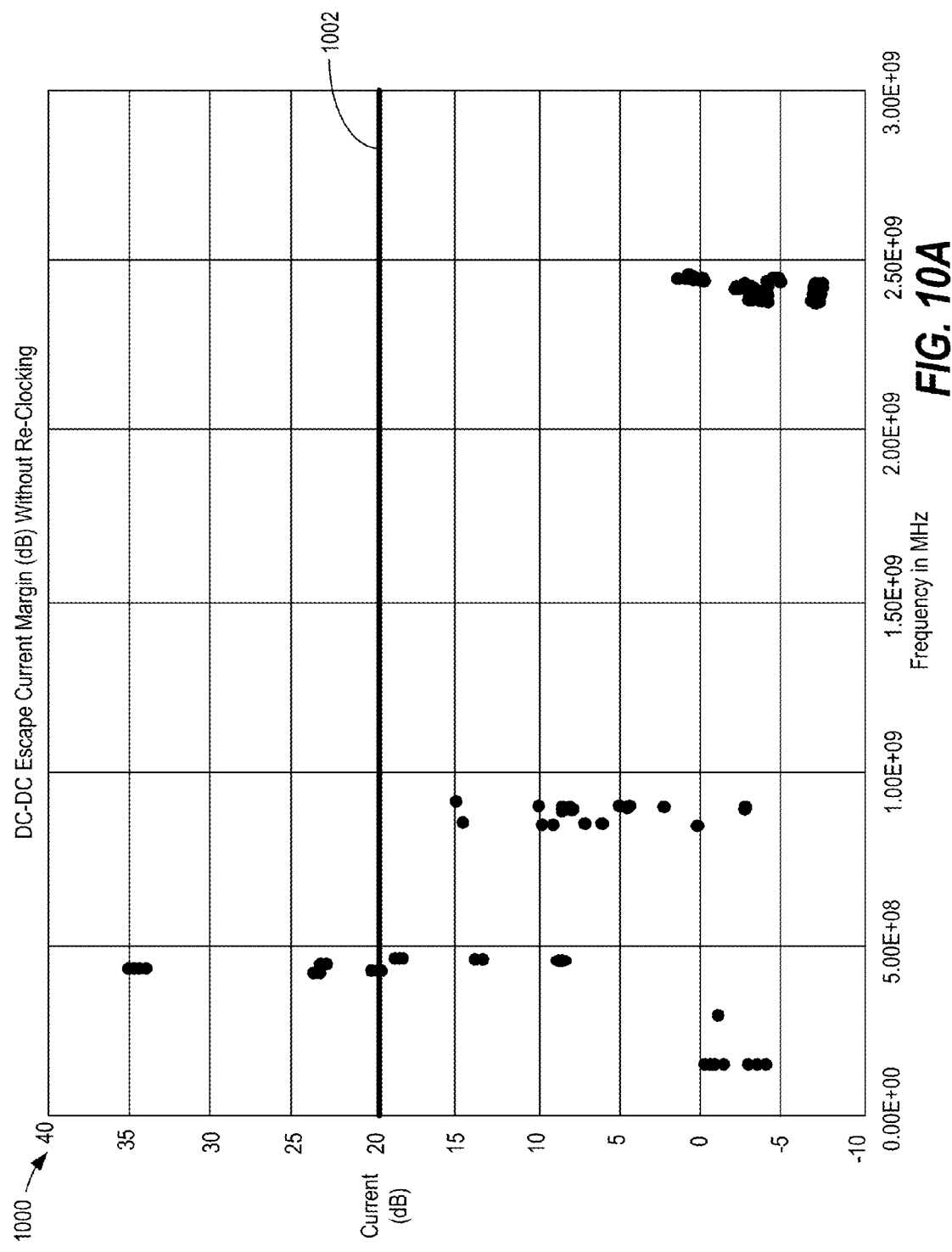
FIG. 10A is a graph of DC-DC converter escape current margin in dB versus frequency for a DC-DC converter without re-timing for over 1000 different receive channels in different receive bands.
Figure 11:
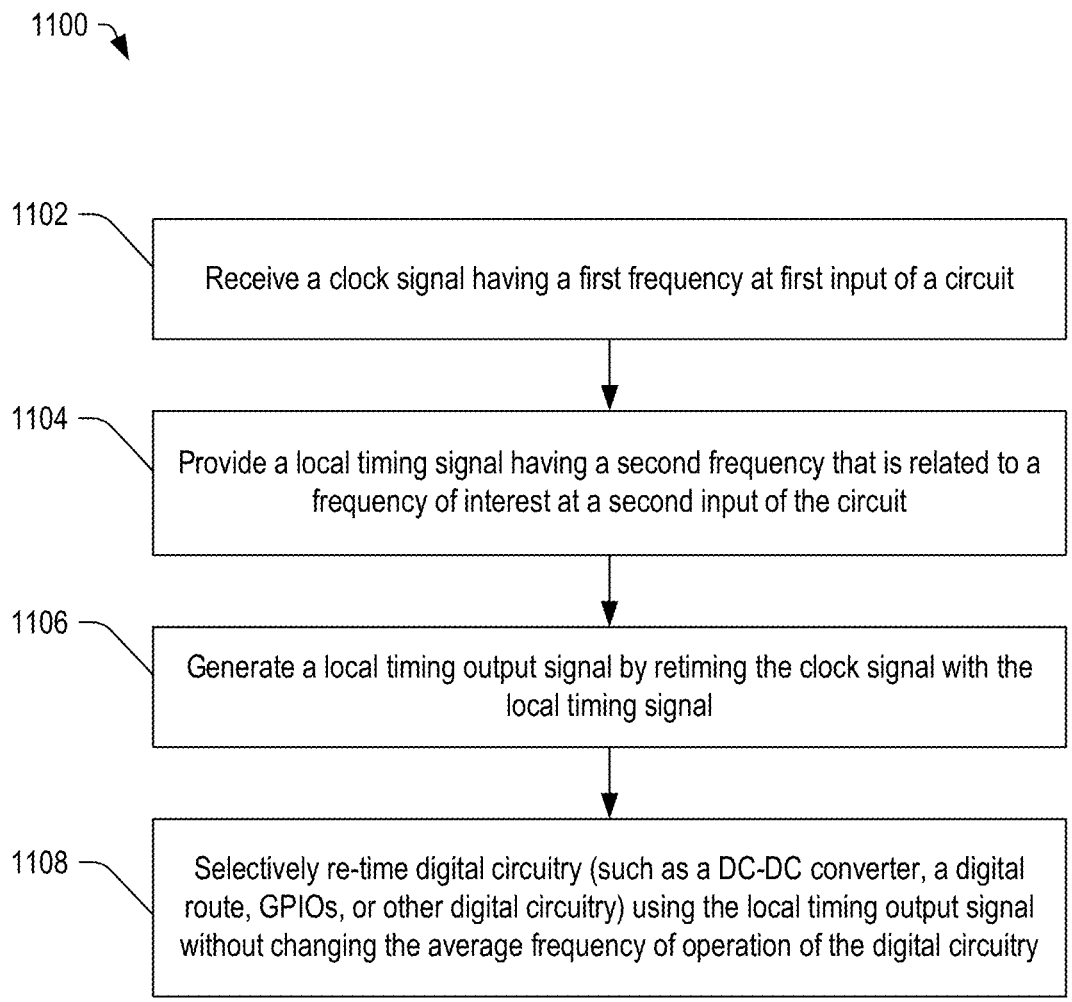
FIG. 11 is a flow diagram of a method of re-clocking circuitry, in accordance with certain embodiments of the present disclosure.

FIG. 10A is a graph 1000 of DC-DC converter escape current margin in dB versus frequency for a DC-DC converter without re-timing for over 1000 different receive channels in different receive bands. The graph 1000 shows the escape currents in decibels for a DC-DC converter 130, without re-clocking, having an operating frequency of approximately 8 MHz using integer division of the local oscillator frequency for a variable PWM signal (varying by 5%) and a variable intermediate frequency. The graph 1000 further includes an escape current threshold 1002 at approximately 20 dB. Without re-clocking, the escape currents for a large number of channels fall below the escape current threshold 1002, which indicates that, for many channels, the escape currents for the DC-DC converter 130 without retiming fall are below a desired level.

Figure 10B:
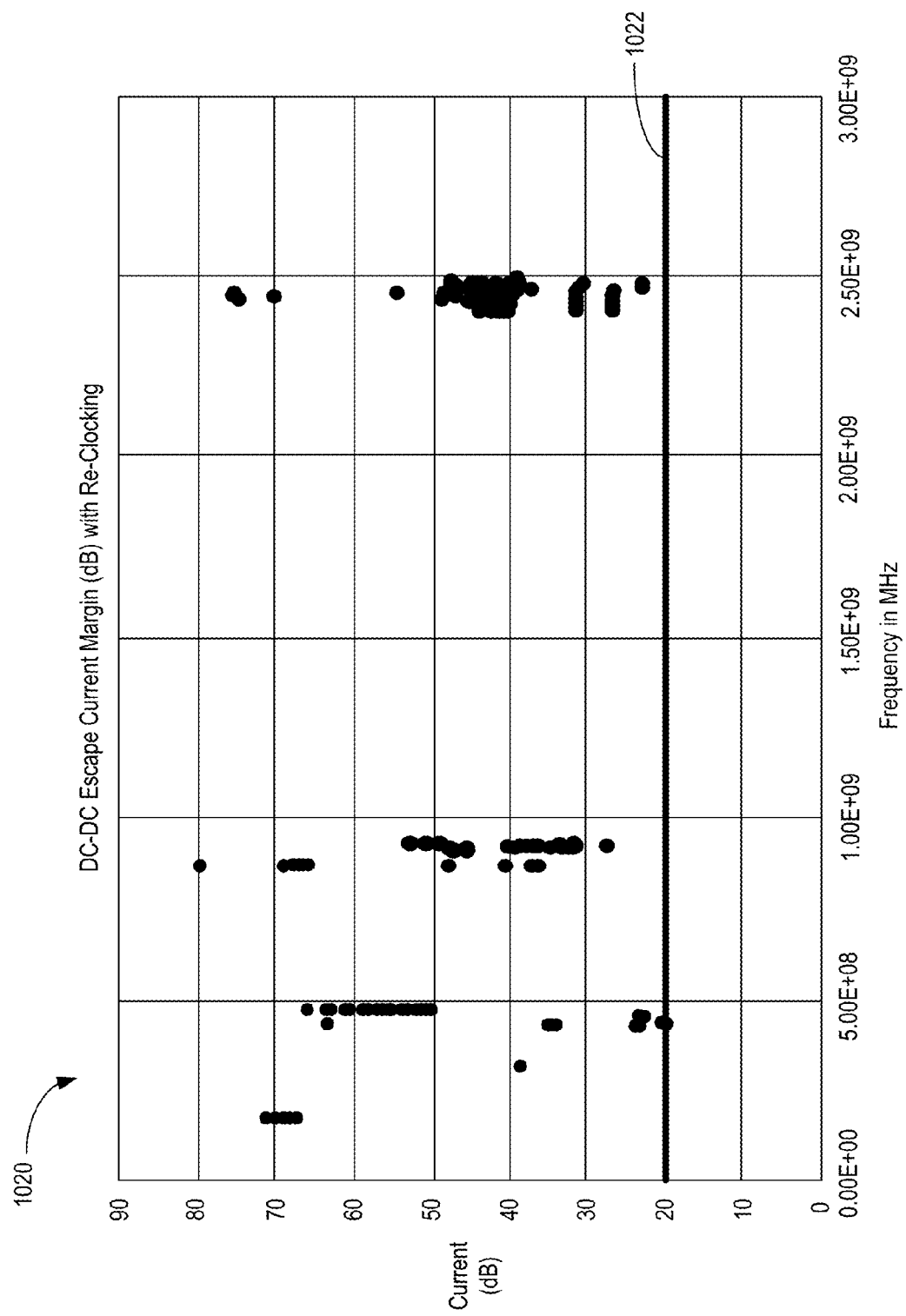
FIG. 10B is a graph of DC-DC converter escape current margin in dB versus frequency for a DC-DC converter with re-timing, in accordance with certain embodiments of the present disclosure, for over 1000 different receive channels in different receive bands.

FIG. 10B is a graph 1020 of DC-DC converter escape current margin in dB versus frequency for a DC-DC converter 130 re-timed in accordance with certain embodiments of the present disclosure for over 1000 different receive channels. The graph 1020 shows the escape current threshold 1022 in decibels for a re-clocked DC-DC converter having an operating frequency of approximately 8 MHz using integer division of the local oscillator frequency for a variable PWM signal (varying by 5%) and a variable intermediate frequency. As shown, the re-clocked DC-DC converter 130 provides an acceptable escape current margin of at least 20 dB across the range of frequencies for all of the receive channels shown. In the preferred embodiment with the escape current margin results in FIG. 10B, the operating frequency of the DC-DC converter 130, the retiming frequency of the DC-DC converter 130, and the IF frequency of the receive channel may be changed for each and every one of the 1000 plus receive channels to achieve the aforementioned 20 dB escape current margin.

In some embodiments, the RF circuit may re-clock one or more circuits using an RF synthesizer to produce a local oscillator signal and optionally using frequency divider circuits, which may frequency divide or otherwise alter the local oscillator signal to produce a local timing signal, which may be used to adjust transition timing of one or more circuits. In a transmit mode, the digital circuitry may utilize a raw crystal oscillator clock. In a receive mode, in order to reduce interference in the channel of interest, the circuit may utilize the local timing signal, which may provide a spectral null or which may otherwise reduce interference in the channel of interest. One possible method of re-clocking a signal is described below with respect to FIG. 11.

FIG. 11 is a flow diagram of a method 1100 of re-clocking circuitry, in accordance with certain embodiments. The method may include receiving a clock signal having a first frequency at first input of a circuit, at 1102. The clock signal may be received from an internal or external clock source. In some embodiments, the clock signal may be received from a crystal oscillator. Advancing to 1104, a local timing signal having a second frequency that is related to a frequency of interest may be provided to a second input of the circuit. The local timing signal may be provided by a local oscillator, a RF frequency synthesizer, a frequency divider circuit, a PLL circuit, another source, or any combination thereof.

Continuing to 1106, a local timing output signal may be generated by retiming the clock signal with the local timing signal. In an example, a flip-flop circuit may re-clock the clock signal using the local timing signal to produce a local timing output signal. Proceeding to 1108, digital circuitry (such as a DC-DC converter, a digital route, GPIOs, other digital circuitry, or any combination thereof) may be selectively re-timed using one or more versions of the local timing output signal without changing the average frequency of operation of the digital circuitry. In an example, during a transmit mode, the DC-DC converter may be re-timed using a local clock signal while the digital route is timed using the raw XO clock signal. In a receive mode, the digital route and the DC-DC converter may be re-timed using one or more local timing output signals.

In some embodiments, a second local timing signal may be generated by a PLL circuit, a frequency divider, or other clock signal generator. The second local timing signal may be provided to another circuit. The second local timing signal may have a frequency that is a fraction of the frequency of the local timing signal provided to the flip-flop circuit.

In some embodiments, the DC-DC converter may be re-clocked to produce a pulse width modulated (PWM) signal having rising edges and falling edges that are quantized in time to one of the one or more versions of the local timing output signal. The DC-DC converter or another switching circuit may receive one or more local timing output signals, which may be divided versions of the LO signal, or the local timing signal provided by the clock signal generator (e.g., synthesizer, divider circuits, other circuits, or any combination thereof). In some embodiments, one or more versions of the local timing output signal may be applied, for example, to a DC-DC converter to produce a PWM output signal having logic transitions that are quantized in time to one of the one or more versions of the local timing output signal.

In some embodiments, the method may further include providing the clock signal to a first output of the circuit and controlling a multiplexer of the circuit to selectively provide one of the raw XO clock signal and the local timing output signal to a second output of the circuit. In some embodiments, switching frequencies of one or more general purpose inputs/outputs of the circuit and a digital route coupled to the circuit maintain a selected average frequency of operation while instantaneous frequencies vary from cycle-to-cycle according to transitions within the local timing output signal. In some embodiments, the circuit may re-time digital circuitry, analog circuitry, radio frequency circuitry, other circuits, or any combination thereof.

In conjunction with the circuits, systems, methods and signal diagrams described above with respect to FIGS. 1-11, a clock signal may be re-clocked or re-timed at a chip level to provide a timing grid from which at least some local switching operations may derive their timing. Further, the DC-DC converter and other associated circuitry may be re-timed to reduce spectral energy at a frequency of interest, such as a receive frequency. In some embodiments, the clock signal may be re-clocked or re-timed based on a local oscillator signal that may be tuned to a frequency of interest during receive operations, and the clock signal (without retiming) may be used during transmit operations.

Although the present invention has been described with reference to preferred embodiments, workers skilled in the art will recognize that changes may be made in form and detail without departing from the scope of the invention.

What is claimed is:

1. An integrated circuit comprising:
  a radio frequency synthesizer configured to provide a local oscillator (LO) signal at a selected frequency related to a channel of interest within an radio frequency (RF) input signal; and
  a re-clocking circuit including a first input to receive a clock signal, a second input to receive a local re-clocking signal related to the LO signal, and an output to provide a timing output signal, the timing output signal being a selected one of the clock signal and a local timing output signal corresponding to a frequency adjusted version of the clock signal based upon the local re-clocking signal;
  a control circuit configured to determine a mode and to selectively control the re-clocking circuit to provide the selected one of the local timing output signal and the clock signal to the output as the local timing output signal; and
  a digital circuit including an input to receive the selected one of the local timing output signal and the clock signal as a digital clock signal.

2. The integrated circuit of claim 1, wherein the digital circuit receives the local timing output signal as the digital clock signal in a receive mode and receives the clock signal as the digital clock signal in a transmit mode.

3. The integrated circuit of claim 1, wherein the re-clocking circuit comprises:
  a Flip-Flop (FF) circuit including the first input to receive the clock signal, the second input to receive the local timing signal, and an output to provide the local timing output signal.

4. The integrated circuit of claim 2, further comprising:
  a multiplexer including a first input to receive the clock signal, a second input to receive the local timing output signal, a control input to receive a selection signal, and an output coupled to a digital route; and
  wherein the control circuit controls the multiplexer to selectively provide one of the clock signal and the local timing output signal to the digital route.

5. The integrated circuit of claim 4, wherein:
  in a transmit mode, the control circuit controls the multiplexer to provide the clock signal to the at least one; and in a receive mode, the control circuit controls the multiplexer to provide the local timing output signal to the at least one.

6. The integrated circuit of claim 1, wherein the local timing signal comprises the selected frequency of the LO signal divided by an integer.

7. The integrated circuit of claim 1, further comprising:
a plurality of general purpose inputs/outputs (GPIOs); and
the local timing signal configured to re-clock at least some of the GPIOs.

8. The integrated circuit of claim 7, wherein:
switching frequencies of the GPIOs and a digital route maintain a selected average frequency of operation; and
instantaneous frequencies vary from cycle-to-cycle according to transitions within the local timing output signal.

9. The integrated circuit of claim 1, further comprising:
a direct current to direct current (DC-DC) converter including:
a ramp generator including an input coupled to the output of a first clock signal generator, and including an output;
a comparator including a first input coupled to the output of the ramp generator, a second input to receive a voltage signal; and an output; and
a flip-flop circuit including a first input coupled to the output of the comparator, a second input coupled to a second clock signal generator, and an output configured to provide a pulse width modulated (PWM) signal having rising edges and falling edges that are quantized in time to a local timing output signal from the second clock signal generator.

10. The integrated circuit of claim 9, wherein an operating frequency of the DC-DC converter is an integer division of the LO signal.

11. The integrated circuit of claim 9, wherein an operating frequency of the DC-DC converter is a fractional division of the LO signal.

12. The integrated circuit of claim 1, further comprising:
a phase locked loop (PLL) circuit including an input coupled to the output of the re-clocking circuit, and including a first output and a second output
a direct current to direct current (DC-DC) converter including a first input coupled to the first output of the PLL circuit coupled to the output of PLL circuit and a second input coupled to the second output of the PLL circuit, the DC-DC converter configured to operate at a frequency of adjusted local timing output signals from the PLL circuit such that DC-DC harmonics of the DC-DC converter are moved relative to the frequency of interest.

13. The integrated circuit of claim 12, wherein a first higher-order harmonic and a second higher-order harmonic of the DC-DC converter are substantially centered around a selected receive channel to reduce interference.

14. An integrated circuit comprising:
a clock system configured to provide a local timing signal at a selected frequency related to a frequency of interest, the clock system including:
a clock signal generator including an input configured to receive a clock signal from a clock signal source, and including an output to provide the local timing signal; and
a re-clocking circuit including a first input to receive the clock signal having a first frequency, a second input to receive the local timing signal, and an output, the re-clocking circuit to provide a local timing output signal; and
a controller configured to determine an operating mode and to selectively provide a control signal to the re-clocking circuit to selectively provide one of the local timing output signal and the clock signal to the output of the re-clocking circuit in response to determining the operating mode.

15. The integrated circuit of claim 14, further comprising:
a multiplexer including an input to receive a raw clock signal from an external source, a second input coupled to the re-clocking circuit to receive the local timing output signal, a control input coupled to the controller to receive the control signal, and an output to provide a selected timing signal; and
wherein:
the controller provides the control signal to the control input to select the local timing output signal when the operating mode is a receive mode; and
the controller provides the control signal to the control input to select the raw clock signal when the operating mode is a transmit mode.

16. The integrated circuit of claim 15, further comprising:
a direct current to direct current (DC-DC) converter including an input coupled to the output and configured to provide a pulse width modulated (PWM) signal having rising edges and falling edges that are quantized in time to a signal related to the local timing output signal; and
wherein the DC-DC converter receives the signal related to the local timing output signal independent of the operating mode.

17. The integrated circuit of claim 16, wherein an operating frequency of the DC-DC converter is an integer division of the local timing signal.

18. The integrated circuit of claim 16, wherein an operating frequency of the DC-DC converter is a fractional division of the local timing signal.

19. The integrated circuit of claim 16, wherein the DC-DC converter comprises:
a ramp generator including an input coupled to the circuit to receive a first timing signal related to the local timing output signal and including an output;
a comparator including a first input coupled to the output of the ramp generator, a second input to receive a voltage, and an output;
a Flip-Flop (FF) circuit including a first input coupled to the output of the comparator, a second input to receive a second timing signal related to the local timing output signal, and an output to provide the PWM signal.

20. The integrated circuit of claim 14, further comprising one or more frequency divider circuits coupled to the output of the clock generator circuit to receive the LO signal and configured to provide one or more local timing signals based on the LO signal.

21. A method comprising:
receiving a clock signal having a first frequency from a clock source at first input of an integrated circuit;
re-clocking the clock signal using a local timing signal having a second frequency that is related to a frequency of interest to produce a local timing output signal; and
selectively retiming digital circuitry using a selected one of the clock signal and the local timing output signal without changing the average frequency of operation of the digital circuitry.

22. The method of claim 21, wherein selectively retiming the digital circuitry comprises retiming a direct-current to direct-current converter to provide a pulse width modulated signal having rising edges and falling edges that are quantized in time to the local timing output signal.

23. The method of claim 21, wherein selectively retiming the digital circuitry comprises controlling a multiplexer of the integrated circuit to selectively provide one of the clock signal and the local timing output signal to an output.

24. The method of claim 23, wherein controlling the multiplexer comprises:
- controlling the multiplexer to selectively provide the clock signal to the output during a transmit operation; and
- controlling the multiplexer to selectively provide the local timing output signal to the output during a receive operation.

* * * * *